(12) United States Patent
Ramaraju

(10) Patent No.: US 7,649,764 B2
(45) Date of Patent: Jan. 19, 2010

(54) MEMORY WITH SHARED WRITE BIT LINE(S)

(75) Inventor: Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 155 days.

(21) Appl. No.: 11/619,808

(22) Filed: Jan. 4, 2007

(65) Prior Publication Data
US 2008/0168231 A1   Jul. 10, 2008

(51) Int. Cl.
*G11C 11/00* (2006.01)
(52) U.S. Cl. ............... 365/154; 365/49.11; 365/189.02
(58) Field of Classification Search .......... 365/154, 365/49, 189.02
See application file for complete search history.

(56) References Cited

U.S. PATENT DOCUMENTS

| 5,483,644 A * | 1/1996 | Richardson ............ 711/3 |
| 7,269,685 B2 * | 9/2007 | Swanson .............. 711/104 |
| 2008/0117707 A1 * | 5/2008 | Manickavasakam et al. ..... 365/230.06 |

* cited by examiner

*Primary Examiner*—Huan Hoang
(74) *Attorney, Agent, or Firm*—Dillon & Yudell LLP

(57) ABSTRACT

A memory includes at least one write bit line and a plurality of memory cells. The at least one write bit line is configured to carry a write bit signal. The plurality of memory cells are arranged in a column and are configured to be selectively coupled to the at least one write bit line. The plurality of memory cells are configured to be selectively read or written in a first phase of a cycle and selectively read or written in a second phase of the cycle using the at least one write bit line.

20 Claims, 7 Drawing Sheets

MEMORY WITH SHARED WRITE BIT LINE(S)

BACKGROUND OF THE INVENTION

1. Field of the Invention

The present disclosure relates generally to a memory and, more particularly, a memory with one or more shared write bit lines.

2. Description of the Related Art

Today, most microprocessor systems employ a hierarchical memory structure. In a typical microprocessor system, a first-level (L1) cache memory (or cache), e.g., a high-speed static random access memory (SRAM), is incorporated within an integrated circuit (IC) that includes at least one central processing unit (CPU) core. A microprocessor system may also include one or more other levels (e.g., a second-level (L2) and a third-level (L3)) of cache coupled between the L1 cache and main memory, e.g., dynamic random access memory (DRAM). The L2 cache, the L3 cache and the main memory typically reside off-chip and are usually progressively slower and cheaper than the L1 cache. However, in some designs, multiple levels of cache are incorporated on-chip with one or more CPU cores. In any case, the caches hold a sub-set of information that corresponds to information stored in the main memory. When information (e.g., an instruction and/or data) addressed by the CPU is stored in the L1 cache (i.e., an L1 cache hit occurs), the information is retrieved directly from the L1 cache and, as such, the CPU can usually process the information without stalling. However, when information addressed by the CPU is not in the L1 cache (i.e., an L1 cache miss occurs), other levels of cache or the main memory are accessed to retrieve the information, which may take a relatively long time period. In this case, the CPU may stall until the information is returned from the other levels of cache or the main memory.

In order for a microprocessor system to function properly, it has been desirable to maintain memory coherency, i.e., coherency between cache(s) and main memory. For example, data stored in main memory should correspond to data that is cached. Memory coherency may be maintained by implementing a write-through or a write-back approach. In the write-through approach, when the CPU writes data to the cache, the same data is immediately written to the main memory. In general, the write-through approach is relatively simple to implement. However, the write-through approach is relatively slow as all data written to the cache is also immediately written to main memory, which may impact CPU performance. On the other hand, the write-back approach writes data in the cache to the main memory at a later time and, as such, it is desirable to implement a mechanism to track when the cache has been modified to maintain memory coherency.

Generally, caches are organized as a plurality of cache lines (also referred to as blocks). A size of a cache line is architecture dependent and may, for example, include 8, 16, 32, 64, 128, 256, or 512 bytes. One situation in which a cache line must be written to main memory to maintain memory coherency is when the cache line has been modified and the modified (dirty) cache line is being evicted from a cache to make room for a new cache line. Using the write-back approach, the dirty cache line is read from the cache and stored in the main memory, before the dirty cache line is replaced by a new cache line. Implementations of the write-back approach generally reduce bus traffic to main memory and generally deliver better performance and consume less power than the write-through approach. Reducing power consumption is particular beneficial in battery-operated devices, such as cellular telephones.

In a cache that employs the write-back approach, a status bit has been maintained to indicate whether a cache line has been modified. One status bit that has been employed to track whether a cache line has been modified has been referred to as a dirty bit. Another status bit that has been employed to indicate whether a cache line is valid has been referred to as a valid bit. The valid bit for each cache line is typically deasserted when the memory system is initialized, e.g., at power-on or at reset. Typically, a single dirty bit and a single valid bit have been employed for each cache line. In the usual case, the dirty bit has been asserted when any byte within an associated cache line has been modified. An asserted dirty bit has indicated that an associated cache line should be written-back to the main memory, when the cache line was evicted from the cache, for example, to make room for a new cache line.

A typical cache system includes three functional blocks: a cache controller, a tag memory, and an information memory (i.e., either a unified data and instruction memory or non-unified data and instruction memories with associated separate tag memories). To service a read request, the cache controller has read the tag memory to determine whether a requested address and its associated target information resided in the cache. When a cache hit occurred, the cache controller has caused the requested information to be provided from the cache. However, if the requested information was not present in the cache, the cache controller forwarded the request to the next level of memory hierarchy (e.g., main memory) in order to load the cache line with the requested information. To make room in the cache for the new information (instruction or data), the cache controller has selected (using, for example, a least recently used (LRU) replacement policy) a cache line in the cache for eviction. If the cache line being evicted from a write-back cache has been modified (as indicated by an asserted dirty bit), the cache controller has caused the modified cache line (or sub-line) to be written to the main memory. When the cache line of a write-back cache has not been modified, the cache controller has simply overwritten the cache line with the new information. To service a write request, the cache controller has determined (by comparing tags to an address) if addressed data was stored in the cache. If a cache hit occurred, the cache controller has updated the data in the cache. When servicing a write request for a write-back cache that experienced a cache hit, a dirty bit for an addressed cache line has been asserted to indicate that data in the addressed cache line has been modified.

Certain caches, in order to enhance efficiency of the caches, have combined tag bits and status bits within a single memory array. In at least some caches so designed, the status bits have been written to the cache in two phases of a cycle (i.e., using a dual phase write). That is, the status bit or bits have been written along with the tag bits of a cache line in a first phase and the status bit or bits have been written independently of the tag bits in a second phase (i.e., a status bit update phase). Unfortunately, implementing dual phase writes of the status bits of a cache has required the implementation of an additional pair of write bit lines and associated write bit line drivers, which has increased a size and power consumption of an associated integrated circuit. While two-way set associative memories have shared write bit lines between cells, cells of two-way set associate memories have not been updated using dual phase writes.

What is needed is a technique that reduces a size of write bit line column of a memory. It would also be desirable for the technique to reduce a power consumption of an associated integrated circuit.

BRIEF DESCRIPTION OF THE DRAWINGS

This invention is described in a preferred embodiment in the following description with reference to the drawings, in which like numbers represent the same or similar elements, as follows.

In the following detailed description of exemplary embodiments of the invention, reference is made to the accompanying drawings, which form a part hereof, and in which is shown by way of illustration specific exemplary embodiments in which the invention may be practiced.

DETAILED DESCRIPTION OF PREFERRED EMBODIMENTS

In the following detailed description of exemplary embodiments of the invention, specific exemplary embodiments in which the invention may be practiced are described in sufficient detail to enable those skilled in the art to practice the invention, but it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims. In particular, while some preferred embodiments may be employed within a wireless mobile communication device, it will be appreciated that the present invention is not so limited and that it has broad application to a variety of devices such as computer systems and other electronic devices, e.g., portable digital assistants (PDAs), digital cameras, portable storage devices, audio players and portable gaming devices.

According to various aspects of the preferred embodiments, a memory is described herein that implements a dual phase write to update a status bit cell of the memory using a single pair of write bit lines. The techniques disclosed herein generally reduce the size of a write bit line column of a status bit cell of a memory, which tends to reduce a power consumption of an integrated circuit (IC) employing the memory. While the discussion herein is primarily directed to a cache subsystem, it is contemplated that the techniques disclosed herein may be generally employed in any device that utilizes multiple phase reads and/or writes in conjunction with a memory cell. For example, a register of a central processing unit (CPU) may be configured according to one or more of the techniques disclosed herein. The techniques disclosed herein are also generally applicable to memory cells that use dual phase reads and/or writes and that implement a single write bit line in conjunction with an inverter (to generate a complement of a write bit signal on the single write bit line). Moreover, it is contemplated that the techniques may be readily extended to memories that employ double-pumped writes. As used herein, the term "coupled" includes both direct and indirect (i.e., elements connected through intervening elements) electrical connection.

Figure 1:
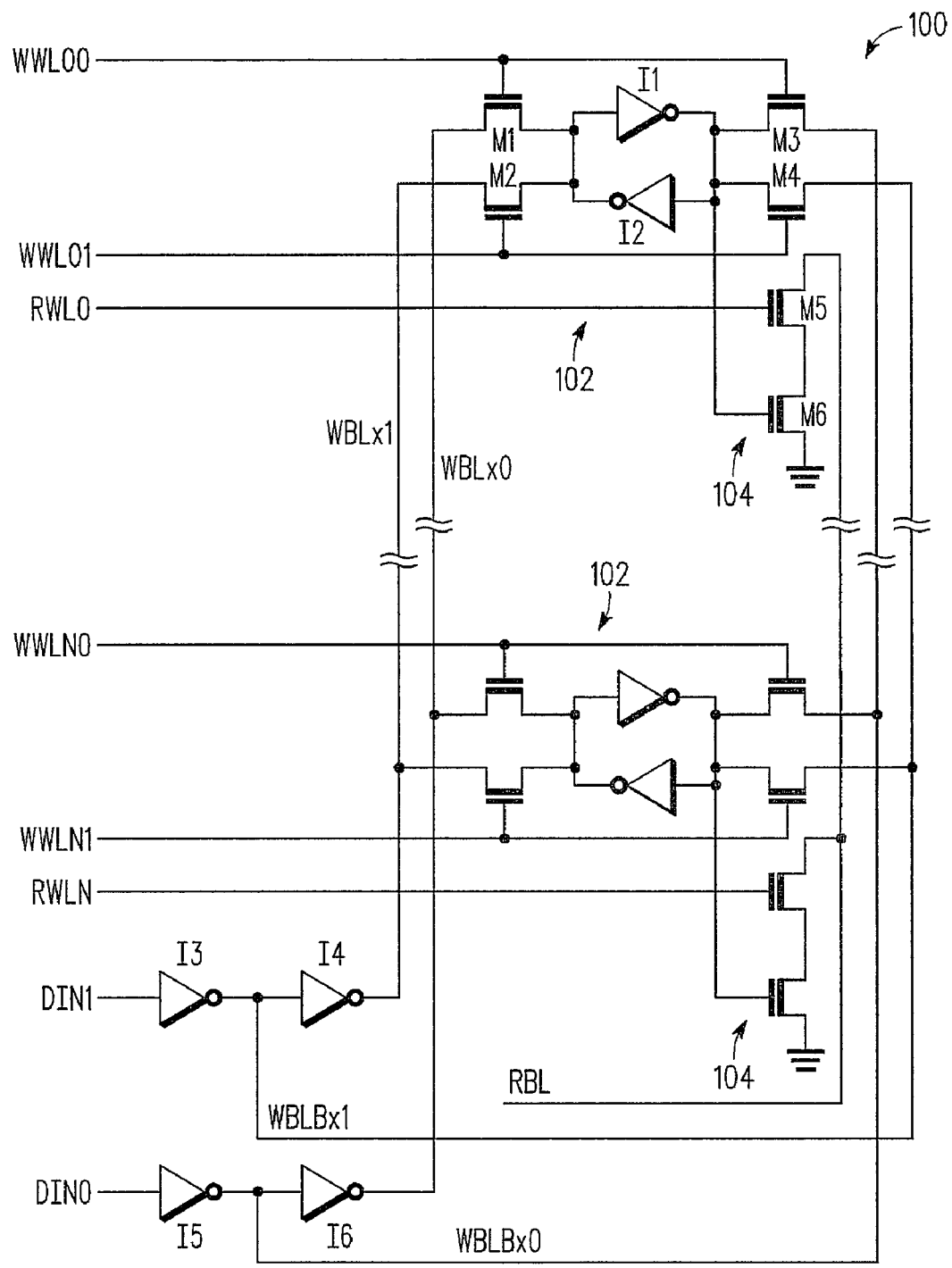
FIG. 1 is an electrical schematic diagram of a status bit cell column of a relevant portion of a tag memory, configured according to the prior art.

With reference to FIG. 1, an electrical schematic diagram of one conventional design of a status bit cell column 100 of a tag memory is depicted. The column 100 includes a plurality of cells 102, each of with include cross-coupled inverters I1 and I2 and access transistors M1-M4, which couple the inverters I1 and I2 to write bit lines. The transistors M1-M4 may be, for example, N-channel metal-oxide semiconductor field-effect transistors (MOSFETs). The transistors M1 and M3 couple the inverters I1 and I2 to a pair of write bit lines WBLx0 and WBLBx0 (for a first phase of a cycle, i.e., phase zero), when a signal is asserted on an associated phase zero write word line (WWLx0). Similarly, the transistors M2 and M4 couple the inverters I1 and I2 to a pair of write bit lines WBLx1 and WBLBx1 (for a second phase of the cycle, i.e., phase one), when a signal is asserted on an associated phase one write word line (WWLx1). As is conventional, a signal on the WBL is the complement of a signal on the WBLB. It should be noted that inverters I5 and I6 provide signals for the first phase and inverters I3 and I4 provide signals for the second phase. The number of cells in column 100 is equal to the number of rows of an associated tag memory (not shown in FIG. 1). In the circuit shown in FIG. 1, the cells 102 are read by asserting a read signal on an appropriate read word line RWL0-RWLN. As is shown, two sets of inverters (i.e., the inverters I3 and I4 and the inverters I5 and I6), one set for each pair of write bit lines (WBLx0/WBLBx0 and WBLx1/WBLBx1), are required to implement a dual phase write according to the prior art. In contrast, only a single set of inverters, i.e., inverters I5 and I6 (see FIGS. 2 and 2A) and a single pair of write bit lines, is implemented to perform a dual phase write according to an embodiment of the present disclosure.

Figure 1A:
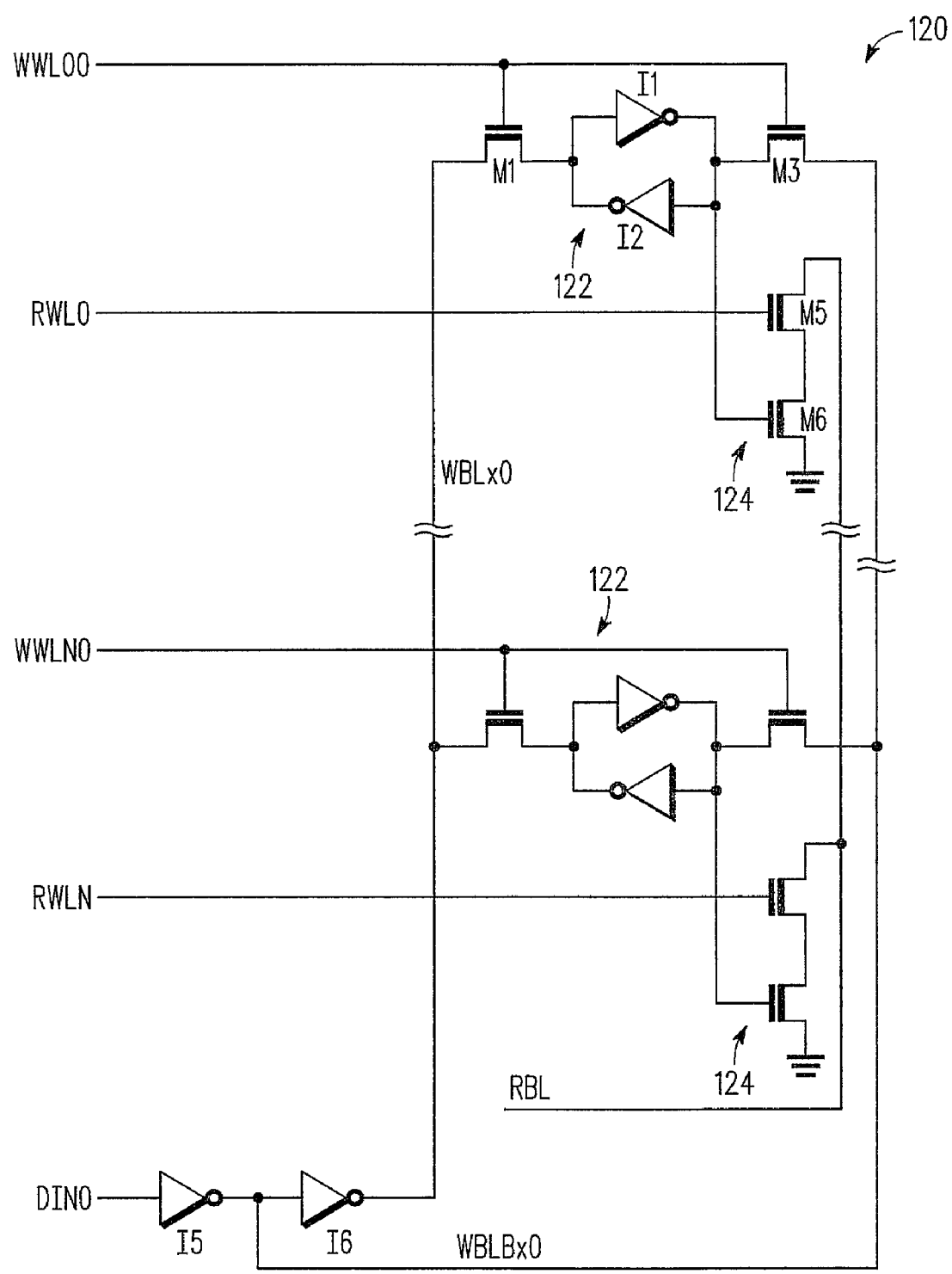
FIG. 1A is an electrical schematic diagram of a tag bit cell column of a relevant portion of a tag memory, configured according to the prior art.

Moving to FIG. 1A, an electrical schematic diagram of one conventional design of a tag bit cell column 120 of a tag memory is depicted. The column 120 includes a plurality of cells 122, each of with include cross-coupled inverters I1 and I2 and access transistors M1 and M3, which couple the inverters I1 and I2 to write bit lines WBLx0 and WBLBx0 (for a first phase of a cycle, i.e., phase zero), when a signal is asserted on an associated phase zero write word line (WWLx0). As is conventional, a signal on the WBL is the complement of a signal on the WBLB. It should be noted that inverters I5 and I6 provide the signals for the first phase. The number of cells in column 120 is equal to the number of rows of an associated tag memory (not shown in FIG. 1A) and the number of columns is equal to the number of bits in a tag cell group of the tag memory. For example, a 64K (65,536 byte) direct mapped cache with 32 bytes per cache line would have 2,048 lines, requiring 16 tag bits (11 line bits and 5 byte bits) to uniquely identify a byte in a cache line. In the circuit shown in FIG. 1A, the cells 120 are read by asserting a read signal on an appropriate one of the read word lines RWL0-RWLN. As is shown, one pair of inverters, one inverter for each write bit line (WBLx0-WBLBx0), is used to implement a write to a row of tag cells according to conventional design.

Figure 2:
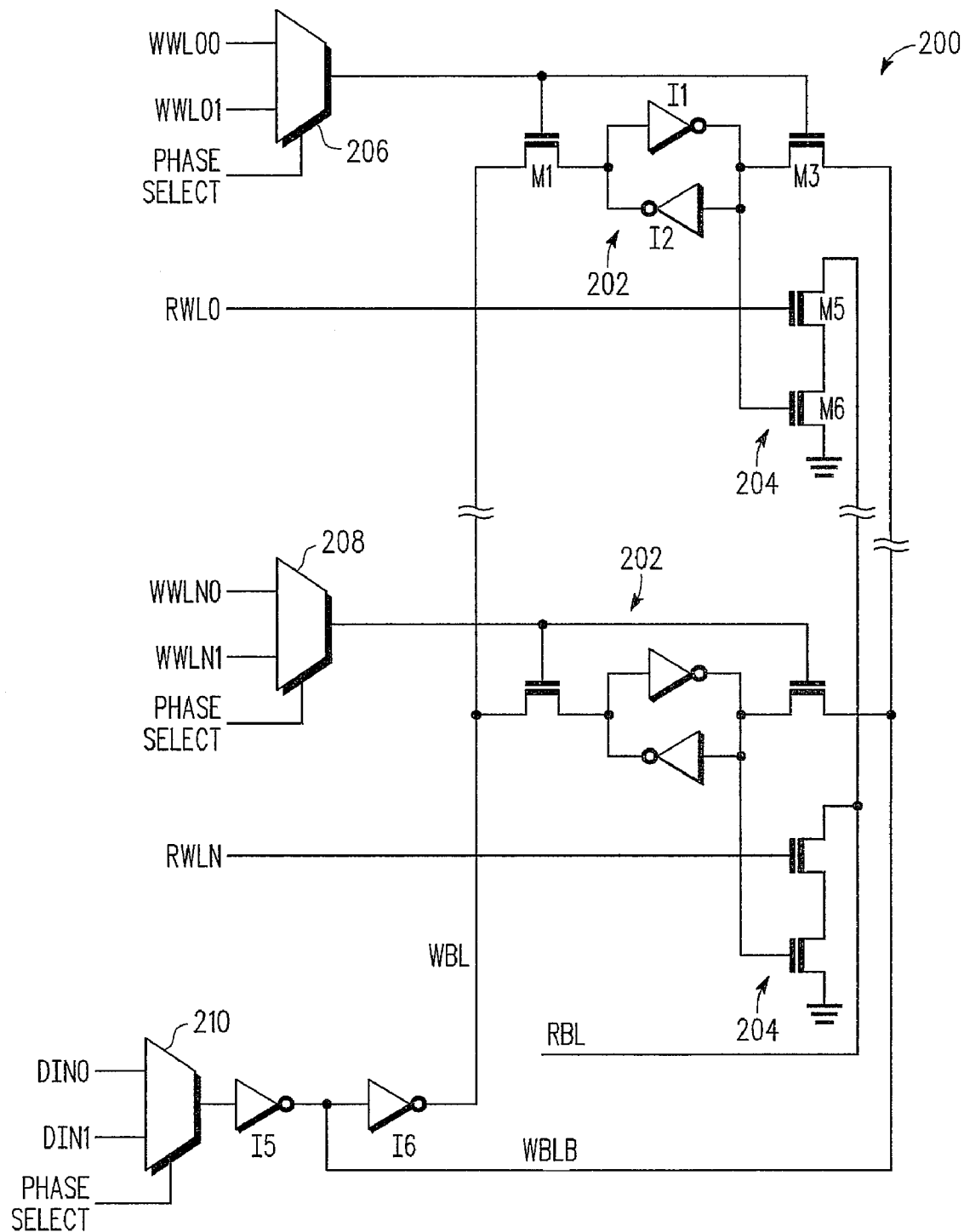
FIG. 2 is an electrical schematic diagram of a status bit cell column of a relevant portion of a tag memory, configured according to an embodiment of the present invention.

Referring to FIG. 2, a status bit cell column 200 of a tag memory constructed according to one aspect of the present disclosure is depicted. It should be appreciated that the preferred embodiments are broadly applicable to direct mapped caches, set associative caches and fully associative caches, as well as register file memories. The column 200 includes a plurality of cells 202, each of with include cross-coupled inverters I1 and I2 and access transistors M1 and M3, which couple the cross-coupled inverters I1 and I2 to write bit lines. More specifically, the transistors M1 and M3 couple the cross-coupled inverters I1 and I2 to a pair of write bit lines WBL and WBLB (for a first phase of a cycle, i.e., phase zero), when a signal is asserted on an associated phase zero write word line (WWLx0) or an associated phase one write word line (WWLx1). As is noted above, a signal on the WBL is the complement of a signal on the WBLB. It should be noted that a phase select signal determines whether signals on the WWLx0 or WWLx1 lines are provided to control terminals of the transistors M1 and M3. The number of cells in column 120 is generally equal to the number of rows of an associated tag memory (not shown in FIG. 1) and the number of columns 120 is generally equal to the number of status bits implemented for a tag cell group of the tag memory. In the circuit shown in FIG. 2, the cells 202 are read by asserting a read signal on an appropriate one of the read word lines RWL0-RWLN. As is shown, while each of the write word lines require a multiplexer, only one set of inverters (i.e., inverters I5 and I6) are used to implement a dualphase write to a status cell.

Figure 2A:
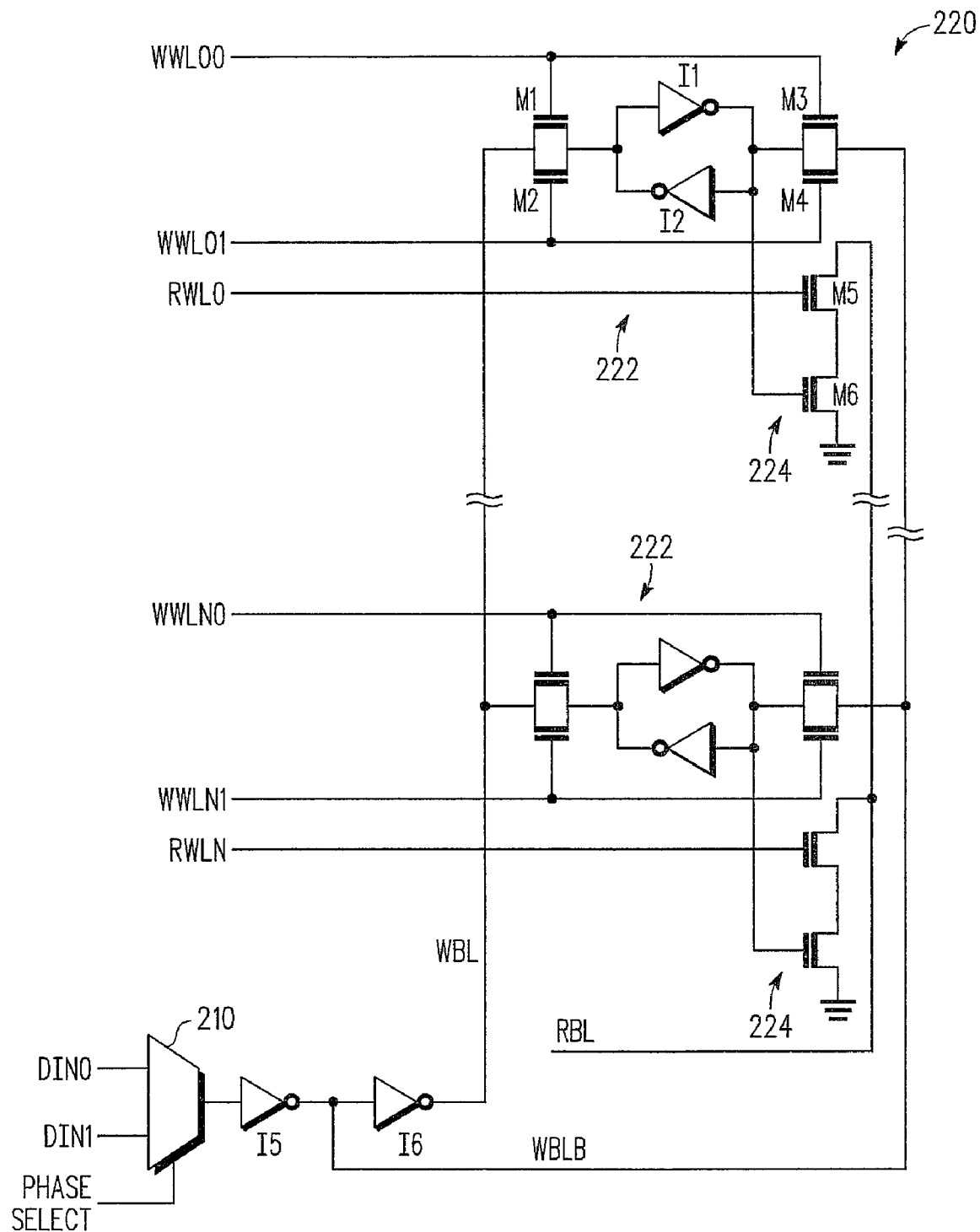
FIG. 2A is an electrical schematic diagram of a status bit cell column of a relevant portion of a tag memory, configured according to another embodiment of the present invention.

Turning to FIG. 2A, a status bit cell column 220 of a tag memory, constructed according to another embodiment of the present disclosure, is depicted. The column 220 includes a plurality of cells 222, each of with include cross-coupled inverters I1 and I2 and access transistors M1 and M3, which couple the inverters I1 and I2 to write bit lines. More specifically, the transistors M1 and M3 couple the inverters I1 and I2 to a pair of write bit lines WBL and WBLB (for a first phase of a cycle, i.e., phase zero), when a signal is asserted on an associated phase zero write word line (WWLx0). Similarly, the transistors M2 and M4 couple the inverters I1 and I2 to the pair of write bit lines WBL and WBLB (for a second phase of a cycle, i.e., phase one), when a signal is asserted on an associated phase one write word line (WWLx1). As is noted above, a signal on the WBL is the complement of a signal on the WBLB. It should be noted that a phase select signal determines whether a data-in phase zero signal (DIN0) or a data-in phase one (DIN1), and their complements, are respectively provided on the write bit lines WBL and WBLB. The number of cells in column 220 is equal to the number of rows of an associated tag memory (not shown in FIG. 2A) and the number of columns is equal to the number of status bits implemented for each tag cell group of the tag memory.

In the circuit shown in FIG. 2A, the cells 222 are read by asserting a read signal on an appropriate one of the read word lines RWL0-RWLN. It should be appreciated that the various embodiments of the present disclosure are also applicable to SRAM cells that do not implement a separate read bit line (i.e., cells that read a status of a cell using the write bit lines).

Figure 2B:
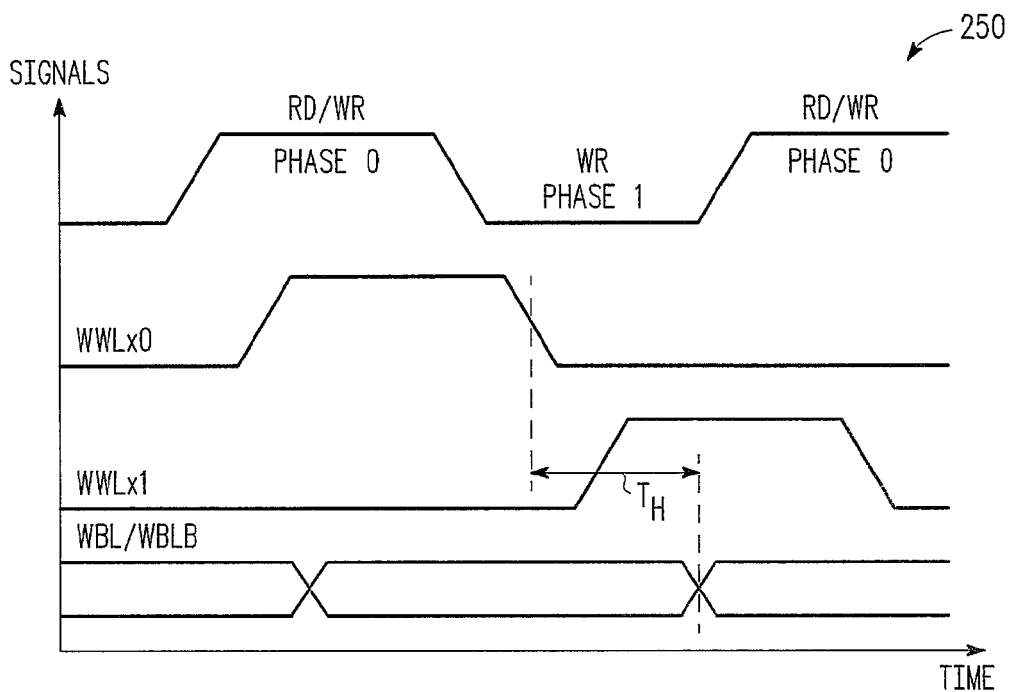
FIG. 2B is an exemplary signal diagram provided for explanation of the operation of the caches of FIGS. 2 and 2A.

As is shown, separate (dual phase) write word lines are implemented in this embodiment. In this case, however, only a single multiplexer (for the DIN0 and DIN1 signals) with a single pair of inverters (i.e., the inverters I5 and I6) is used to implement a dual phase write to a status cell, as contrasted with the prior art which employs two pairs of inverters. FIG. 2B presents an exemplary timing diagram 250 that is applicable to the operation of a memory cell employing a dual phase operation and shows a relationship between signals on write word lines and write bit lines. More specifically, in a first phase (phase 0) a read or a write of a memory cell is performed, when a write word line (WWLx0) is asserted. In a second phase (phase 1) a write of a signal (on write bit lines WBL and WBLB) is performed on the memory cell, when a write word line (WWLx1) is asserted.

Figure 3:
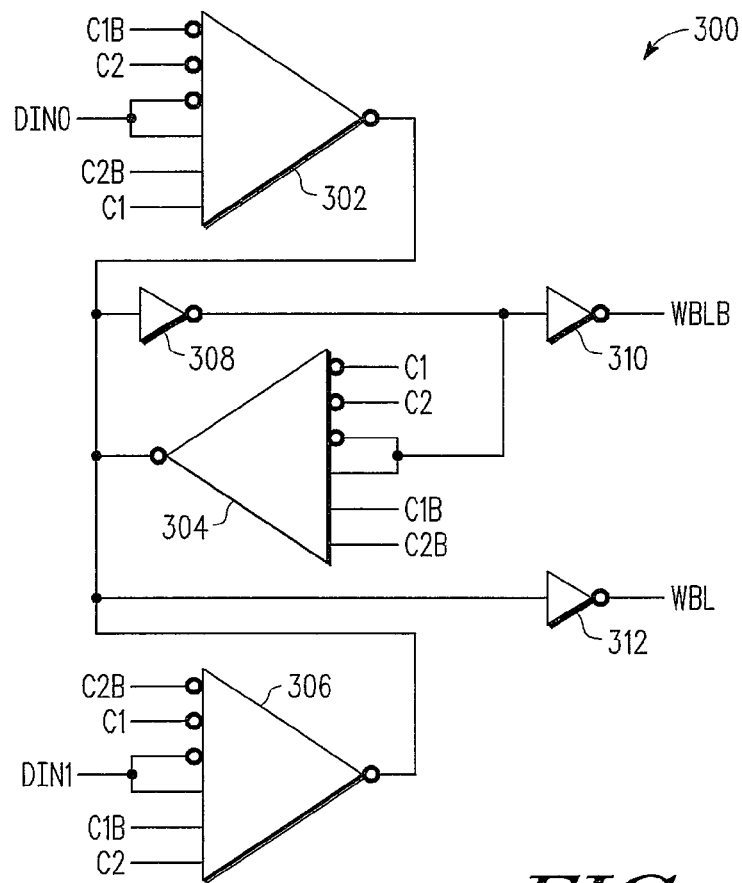
FIG. 3 is an electrical schematic diagram of a latched multiplexer driver for providing write bit line (WBL) and write bit line complement (WBLB) signals for the circuits of FIGS. 2 and 2A.

With reference to FIG. 3, a latched multiplexer driver 300, for providing complementary write bit line (WBL and WBLB) signals based on a phase zero data-in (DIN0) signal and a phase one data-in signal (DIN1), is depicted. As is shown, the driver includes tri-state inverters 302, 304 and 306 and inverters 308, 310 and 312. Respective inverting inputs of the inverter 302 receive an inverted phase zero clock (C1B) signal, a phase one clock (C2) signal and a data-in phase zero (DIN0) signal. Respective non-inverting inputs of the inverter 302 receive the DIN0 signal, an inverted phase one clock signal (C2B) signal, a phase zero clock signal (C1). An output of the inverter 302 is coupled to inputs of the inverters 308 and 312. An output of the inverter 308 is coupled to an input of the inverter 310, whose output provides the WBLB signal. An output of the inverter 312 provides the WBL signal. Respective inverting inputs of the inverter 306 receive the C2B signal, the C1 signal and a data-in phase one (DIN1) signal. Respective non-inverting inputs of the inverter 306 receive the DIN1 signal, the C1B signal and the C1 signal. An output of the inverter 306 is coupled to the input of the inverter 308. Respective inverting inputs of the inverter 304 receive the C1 signal and the C2 signal. Another inverting input of the inverter 304 is coupled to the output of the inverter 308. Respective non-inverting inputs of the inverter 302 receive the C1B signal and the C2B signal. Another non-inverting input of the inverter 304 is coupled to the output of the inverter 308. An output of the invert 304 is coupled to the input of inverter 308.

Figure 3A:
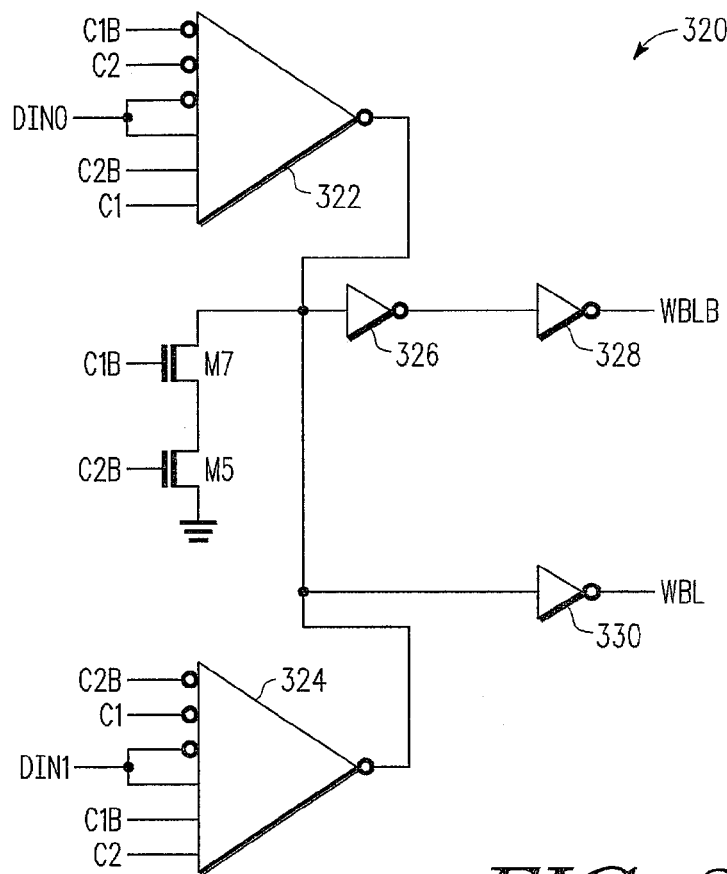
FIG. 3A is an electrical schematic diagram of another multiplexer driver for providing the WBL and WBLB signals for the circuits of FIGS. 2 and 2A.

With reference to FIG. 3A, a multiplexer driver 320, for providing complementary write bit line (WBL and WBLB) signals based on a phase zero data-in (DIN0) signal and a phase one data-in signal (DIN1), is depicted. As is shown, the driver 320 includes tri-state inverters 322 and 324, inverters 326, 328 and 330 and transistors M7 and M8. Respective inverting inputs of the inverter 322 receive an inverted phase zero clock (C1B) signal, a phase one clock (C2) signal and a data-in phase zero (DIN0) signal. Respective non-inverting inputs of the inverter 322 receive the DIN0 signal, an inverted phase one clock signal (C2B) signal and a phase zero clock signal (C1). An output of the inverter 322 is coupled to an input of the inverters 326 and 330. An output of the inverter 326 is coupled to an input of the inverter 328, whose output provides the WBLB signal. An output of the inverter 330 provides the WBL signal. Respective inverting inputs of the inverter 324 receive the C2B signal, the C1 signal and a data-in phase one (DIN1) signal. Respective non-inverting inputs of the inverter 306 receive the DIN1 signal, the C1B signal and the C2 signal. An output of the inverter 324 is coupled to an input of the inverter 326. A first terminal of a transistor M8 is coupled to ground and a second terminal of the transistor M8 is coupled to a first terminal of a transistor M7. A second terminal of the transistor M7 is coupled to an input of the inverter 326. A control terminal of the transistor M7 receives the C1B signal and a control terminal of the transistor M8 receives the C2B signal.

Figure 4:
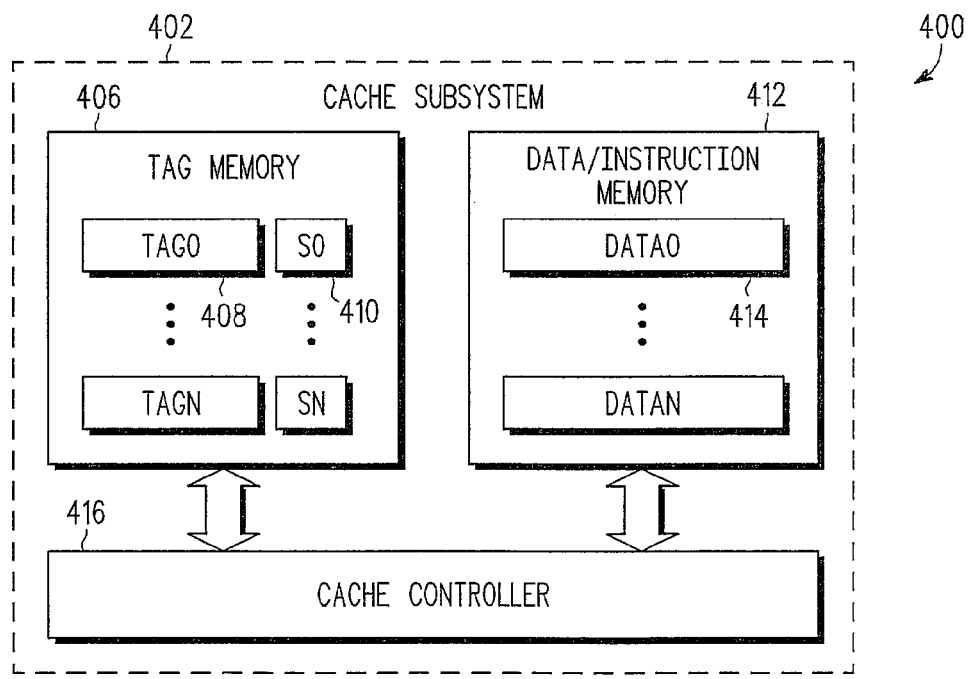
FIG. 4 is an exemplary electrical block diagram of a cache subsystem, whose tag memory may be constructed according to the embodiments of FIGS. 2 and/or 2A.

Turning to FIG. 4, an exemplary cache subsystem 400 is illustrated. The subsystem 400 includes a tag memory 406, a cache (i.e., a data and/or instruction memory) 412 and a cache controller 416 coupled to the tag memory 406 and the cache 412. The cache subsystem 400 may be implemented, for example, as a L1, an L2 and/or an L3 cache subsystem. The tag memory 406 includes a plurality of tag cells, arranged in tag group cells 408, and a plurality of status cells 410. The tag group cells 408 may include multiple columns constructed according to FIG. 1A. The status cells 410 may be configured according to the embodiments shown in FIGS. 2 and 2A and may include multiple columns (e.g., a column for a valid bit and a column cell for a dirty bit, etc.). Each of the tag cell groups 408 is associated with a respective cache line 414 of cache 412. The cache 412 may store instructions and/or data. The cache 412 and the tag memory 406 may be incorporated within a single memory array or functionally separate memory arrays and may be incorporated within a single integrated circuit, which may include one or more central processing unit (CPU) cores.

Figure 5:
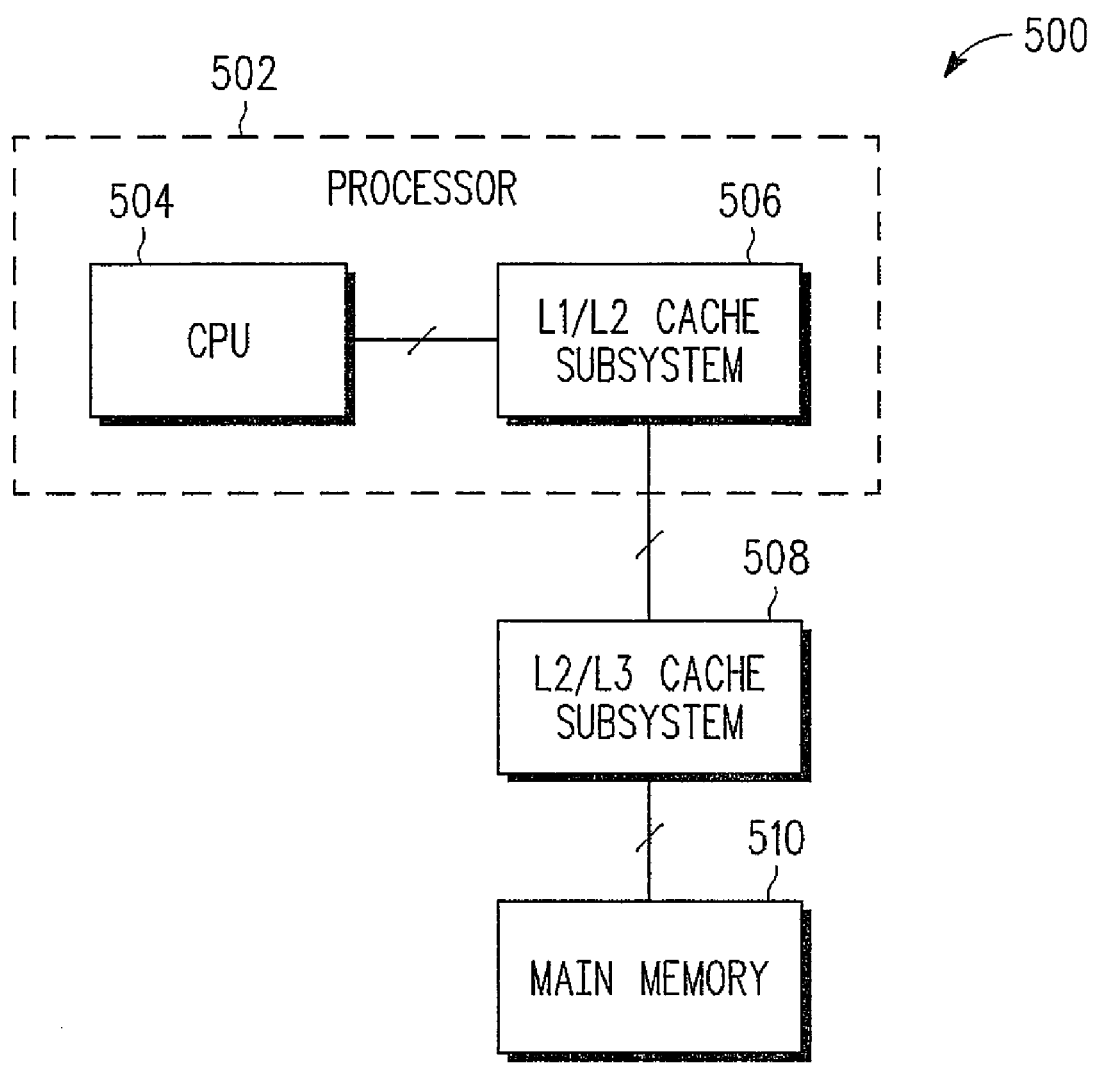
FIG. 5 is an exemplary electrical block diagram of processor system employing the cache subsystem of FIG. 4.

FIG. 5 depicts an exemplary processor system 500 that includes a processor 502 having at least one central processing unit (CPU) core 504 coupled to an on-chip L1/L2 cache subsystem 506, which may be configured in a similar manner to the cache subsystem 400 of FIG. 4. The processor 502 is configured to execute an application appropriate software system (e.g., an operating system and one or more applications). The subsystem 506 is coupled to an off-chip cache subsystem 508, which may include L2 and/or L3 cache, depending upon the architecture of the processor 502. For example, the processor 502 may include both L1 and L2 cache on-chip. In this case the subsystem 508 may only incorporate L3 cache. As another example, the processor 502 may only include L1 cache, in which case the subsystem 508 may include both L2 and L3 cache. In either case, the cache subsystem 508 is coupled to the main memory 510. In a typical embodiment, the L1, L2 and L3 cache each comprise an application appropriate amount of static random access memory (SRAM) and the main memory comprises an application appropriate amount of dynamic random access memory (DRAM). The CPU 504 may also include registers which may be configured according to various aspects of the present disclosure. More specifically, one or more of the registers may be read and/or written in multiple phases of a cycle using shared write bit lines or a shared write bit line (in implementations that internally generate a complement of write bit signal, which is provided on the shared write bit line). The memories disclosed herein may be encoded within one or more design files (e.g., design files for a processor integrated circuit, or design files for a memory integrated circuit) on one or more computer readable storage media, e.g., compact disk read-only memory (CD-ROM), etc.

While the invention has been particularly shown and described with reference to preferred embodiments, it will be understood by those skilled in the art that various changes in form and detail may be made therein without departing from the spirit and scope of the invention. Any variations, modifications, additions, and improvements to the embodiments described are possible and may fall within the scope of the invention as detailed within the following claims.

What is claimed is:

1. A memory, comprising:
  a first write bit line configured to carry a write bit signal;
  a second write bit line configured to carry a complementary write bit signal that is complementary to the write bit signal associated with the first write bit line; and
  a plurality of memory cells, wherein the plurality of memory cells are arranged in a column and are configured to be selectively coupled to the first and second write bit lines, and wherein each of the plurality of memory cells are configured to be selectively written in a first phase of a cycle with a first data source and selectively written in a second phase of the cycle with a second data source using the first and second write bit lines, where the first and second data sources are different data sources.

2. The memory of claim 1, wherein the plurality of memory cells are static random access memory (SRAM) cells and the memory functions as a register of a central processing unit (CPU).

3. The memory of claim 1, wherein the plurality of memory cells each respectively store a valid bit for a tag cell group.

4. The memory of claim 1, wherein the plurality of memory cells each respectively store a dirty bit for a tag cell group.

5. The memory of claim 1, further comprising:
  a pair of access transistors for each of the plurality of memory cells, wherein one of the pair of access transistors is configured to selectively couple a first side of an associated one of the plurality of memory cells to the first write bit line and a remaining one of the pair of access transistors is configured to selectively couple a second side of the associated one of the plurality of memory cells to the second write bit line.

6. The memory of claim 1, further comprising:
  a multiplexer including a first input, a second input and an output, wherein the first input of the multiplexer is configured to receive first data, the second input of the multiplexer is configured to receive second data and the output of the multiplexer is coupled to the first write bit line, and wherein the multiplexer is configured to provide the first data from the first data source to the first write bit line during the first phase of the cycle and the second data from the second data source to the first write bit line during the second phase of the cycle.

7. The memory of claim 6, further comprising:
  a first inverter including an input and an output; and
  a second inverter including an input and an output, wherein the input of the first inverter is coupled to the output of the multiplexer and the output of the first inverter is coupled to the input of the second inverter and the first write bit line, and wherein the output of the second inverter is coupled to the second write bit line.

8. A cache subsystem, comprising:
  a cache memory;
  a tag memory, comprising:
    a plurality of tag cells arranged in tag cell groups and configured to store a plurality of multiple bit tags, wherein each of the plurality of multiple bit tags identify a respective line of the cache memory; and
    a plurality of status cells, wherein at least one of the plurality of status cells is associated with each respective one of the tag cell groups, and wherein each of the plurality of status cells are configured to be written to in a first phase of a cycle with a first data source and written in a second phase of the cycle with a second data source using shared write bit lines that are complementary; and a cache controller coupled to the cache memory and the tag memory, wherein the first and second data sources are different data sources.

9. The cache subsystem of claim 8, wherein the tag memory and the cache memory comprise static random access memory (SRAM).

10. The cache subsystem of claim 8, wherein the plurality of status cells store a valid bit and a dirty bit for each of the tag cell groups.

11. The cache subsystem of claim 8, wherein the cache memory is an associative cache memory.

12. The cache subsystem of claim 8, wherein the cache memory is a direct-mapped cache memory.

13. The cache subsystem of claim 8, wherein the cache memory is configured in a write-back arrangement.

14. The cache subsystem of claim 8, further comprising:
a multiplexer including a first input, a second input and an output, wherein the first input of the multiplexer is configured to receive first data from the first data source for the first phase of the cycle, the second input of the multiplexer is configured to receive second data from the second data source for the second phase of the cycle and the output of the multiplexer is coupled to the shared write bit lines, and wherein the multiplexer is configured to provide the first data to the shared write bit lines during the first phase of the cycle and the second data to the shared write bit lines during the second phase of the cycle.

15. The cache subsystem of claim 14, further comprising:
a first inverter including an input and an output; and
a second inverter including an input and an output, wherein the shared write bit lines includes a first write bit line and a second write bit line, and wherein the input of the first inverter is coupled to the output of the multiplexer and the output of the first inverter is coupled to the input of the second inverter and the first write bit line, where the output of the second inverter is coupled to the second write bit line.

16. A method, comprising:
writing a first memory cell in a first phase of a cycle with a first data source using a first write bit line; and
writing a second memory cell using the first write bit line during a second phase of the cycle with a second data source, wherein the first write bit line includes two complementary write bit lines, and wherein the first and second data sources are different data sources.

17. The method of claim 16, wherein the first and second memory cells are a same memory cell.

18. The method of claim 16, wherein the first and second memory cells are different memory cells.

19. A memory, comprising:
a first write bit line configured to carry a first write bit signal;
a second write bit line configured to carry a second write bit signal that is a complement of the first write bit signal;
a plurality of memory cells, wherein the plurality of memory cells are arranged in a column and are configured to be selectively coupled to the first and second write bit lines, and wherein each of the plurality of memory cells are configured to be selectively written in a first phase of a cycle with a first data source and selectively written in a second phase of the cycle with a second data source using the first and second write bit lines;
a multiplexer including a first input, a second input and an output, wherein the first input of the multiplexer is configured to receive first data and the second input of the multiplexer is configured to receive second data, and wherein the output of the multiplexer is configured to provide the first data from the first data source during the first phase of the cycle and the second data from the second data source during the second phase of the cycle;
a first inverter including an input and an output; and
a second inverter including an input and an output, wherein the input of the first inverter is coupled to the output of the multiplexer and the output of the first inverter is coupled to the input of the second inverter and the first write bit line, and wherein the output of the second inverter is coupled to the second write bit line, where the first and second data sources are different data sources.

20. The memory of claim 19, wherein the plurality of memory cells are static random access memory (SRAM) cells.

* * * * *